United States Patent [19]

Hoshino et al.

[11] Patent Number: 5,629,627
[45] Date of Patent: May 13, 1997

[54] INSPECTION DEVICE FOR A WATERPROOF CONNECTOR

[75] Inventors: Takanari Hoshino; Atsushi Takani, both of Yokkaichi, Japan

[73] Assignee: Sumitomo Wiring Systems, Ltd., Japan

[21] Appl. No.: 479,221

[22] Filed: Jun. 7, 1995

[30] Foreign Application Priority Data

Jun. 13, 1994 [JP] Japan .................................... 6-130525

[51] Int. Cl.⁶ ................................................ G01R 27/26
[52] U.S. Cl. ................................................ 324/538; 439/310
[58] Field of Search ............................ 439/310; 324/538, 324/72.5, 754, 761

[56] References Cited

U.S. PATENT DOCUMENTS

| | | | |
|---|---|---|---|
| 4,232,262 | 11/1980 | Emo et al. | 324/538 |
| 4,902,968 | 2/1990 | Sugimoto | 324/538 |
| 5,335,413 | 8/1994 | Yamamoto et al. | 324/538 |
| 5,419,711 | 5/1995 | Noro et al. | 439/310 |
| 5,429,519 | 7/1995 | Murakami | 439/310 |
| 5,455,515 | 10/1995 | Suijo et al. | 324/538 |
| 5,467,023 | 11/1995 | Takeyama | 324/754 |
| 5,481,204 | 1/1996 | Aikawa | 324/538 |

FOREIGN PATENT DOCUMENTS

| | | |
|---|---|---|
| 0565080A2 | 10/1993 | European Pat. Off. . |
| 4179075 | 7/1992 | Japan ............. 439/310 |
| 2169153 | 7/1986 | United Kingdom . |
| 2281454 | 3/1995 | United Kingdom . |

*Primary Examiner*—Maura K. Regan
*Attorney, Agent, or Firm*—Banner & Witcoff, Ltd.

[57] ABSTRACT

The invention comprises a device provided with a position-setting surface and relatively movable stopping member which together hold the housing 31 of a waterproof electrical connector in a predetermined inspecting position. Pressing pieces are integrally provided on the position-setting surface or the stopping member to push in any waterproof plug associated with a terminal in the direction in which the terminal is inserted into the terminal accommodation chamber.

This arrangement ensures that a semi-fitted terminal is pushed into the correct position during an inspection process.

16 Claims, 10 Drawing Sheets

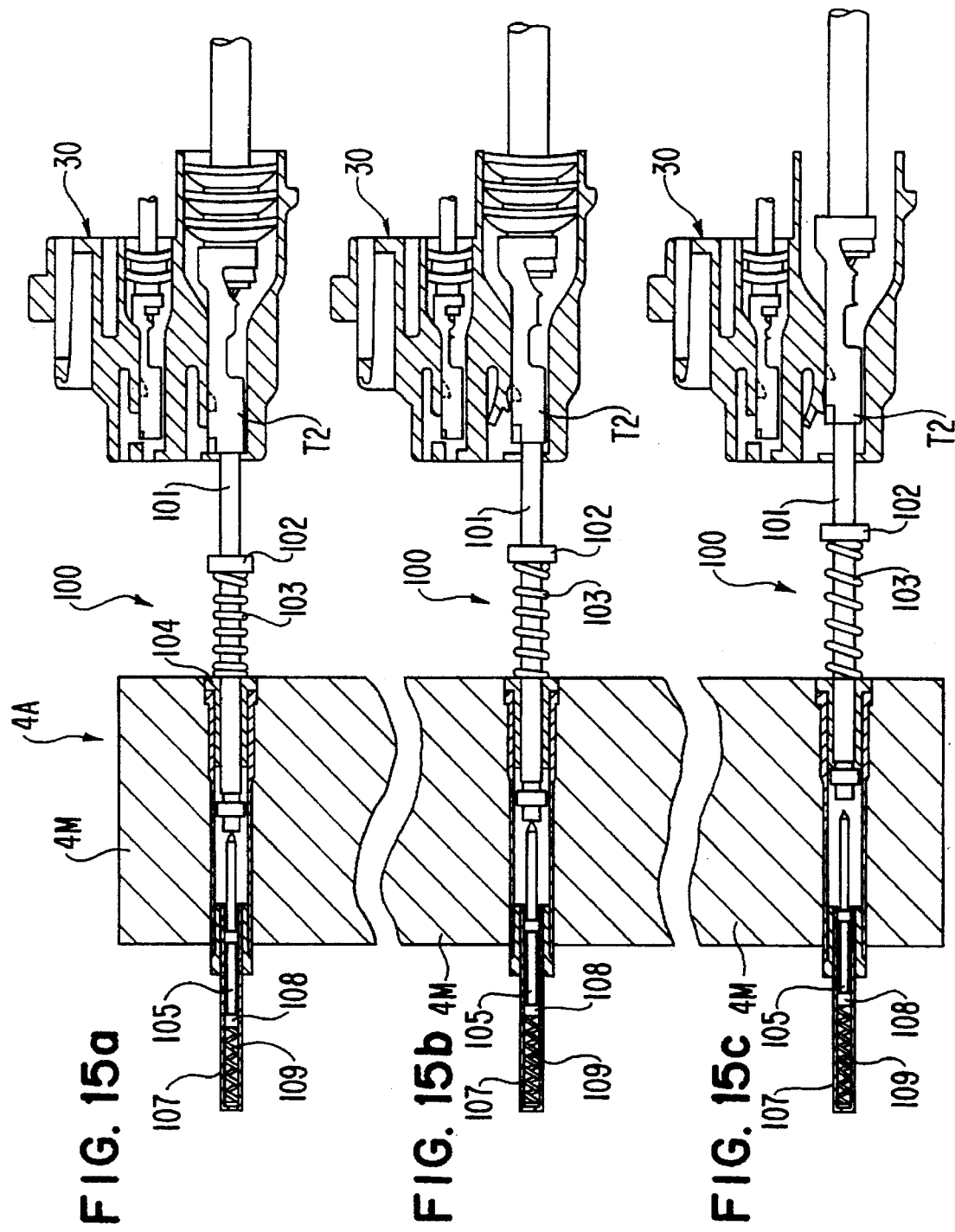

INSPECTION DEVICE FOR A WATERPROOF CONNECTOR

TECHNICAL FIELD

The present invention relates to an inspection device for waterproof electrical connectors, and more specifically to a device for inspecting such aspects as the state of installation of the terminal in such connectors.

BACKGROUND OF THE INVENTION

These connectors are used, inter alia, to make connections between electrical appliances, and provide the interconnections between wire harnesses used in automobiles, industrial building machinery and elsewhere. In general, waterproof electrical connectors comprise a housing made from a synthetic resin material, a terminal-accommodation chamber formed in the housing, a terminal fixed to the end of an electrical wire and accommodated in the terminal-accommodation chamber, and a waterproof plug fixed to the end of the electrical wire as well as the terminal (see for example Laid-open Japanese Patent Application Hei 4-65074 and Laid-open Japanese Utility Model Sho 63-69373).

The above-mentioned waterproof plug is formed with a larger diameter than the terminal. An opening is formed in the housing on the insertion side contiguous with a terminal-accommodation chamber. The insertion side opening is formed with a larger diameter than the terminal-accommodation chamber and defines a peripheral surface for sliding contact with the outer circumferential surface of the waterproof plug. In use, the terminal is inserted via the insertion side opening into the terminal-accommodation chamber and is fixed in the-housing by what is termed a lance. By inserting the terminal piece into the housing from the insertion side opening, the waterproof plug seals the insertion side opening.

In the process of making such a connector, it is usual to check for correct installation of the terminal. The inspection checks such aspects as whether the terminal is inserted correctly in the housing and has been engaged by the lance and whether the crimping of the wire on to the terminal has been well effected. This is because the performance of a product using the connector will be defective if a terminal has not been inserted, if the insertion of the terminal is incomplete, or if the crimping of the electrical wire is poor.

Inspecting devices for checking the passage of the terminal are disclosed, for example, in Laid-Open Japanese Utility Model Application Sho 57-89964. Published Japanese Utility Model Sho 55-8221, Laid-open Japanese Utility Model Application Sho 64-27668, and Laid-open Japanese Patent Applications Hei 5-26939, Hei 5-288793 and Hei 5-234660.

These devices are equipped with a stopping means for holding the connector housing in a predetermined inspection position, and detectors which press resiliently onto the terminals inside the housing so held. The above-mentioned detectors are arranged in such a way that they are urged in the direction opposite the direction in which the terminal is inserted by means of an urging member, and that the displacement position can be sensed by means of a sensor.

When the terminals are properly installed in the housing, the detectors are pushed in the terminal insertion direction, overcoming the urging force of the urging member, and the sensor senses the correct installation of the terminal. If a terminal is not inserted in the housing, or is not engaged by the lance the detector projects towards the terminal-accommodation chamber, due to the urging force of the above-mentioned urging member, and therefore the sensor is able to sense a defect in the connector. Furthermore, even when a terminal has been inserted incompletely (referred to as "semi-fitted" in this specification), the urging member pushes the terminal towards the insertion side opening and therefore the detector projects towards the terminal-accommodation chamber and can sense a defect in the connector.

However, when a connector of this configuration is inspected by the conventional connector inspecting device described above, there are occasions when the semi-fitted state cannot be detected reliably. This is because where waterproof connectors are concerned, and particularly when a large-diameter waterproof plug is used, the larger the surface area of compressed contact between the waterproof plug and the insertion side opening, the larger will be the frictional resistance thereof, and the displacement of the detector by the urging member will be limited.

In particular, this is because, when a dual arrest structure is adopted in which the terminal is directly or indirectly held in the housing using a retainer formed by a member separate to the housing, the holding forces are larger than the urging force (e.g. 2 kgf) of the above-mentioned urging member and the displacement of the detector is insufficient.

Furthermore, there have been proposals to set the urging force of the above-mentioned urging member at an increased level to prevent this disadvantage, but these are undesirable since in this case there are excessive loads on the terminal and the lance, as well as on the retainer, when the terminal is correctly inserted.

The present invention takes the above disadvantage into account and aims to provide an inspecting device for waterproof connectors which is able to correct semi-fitting during the inspection step.

SUMMARY OF THE INVENTION

According to the present invention there is provided an inspection device for an electrical connector having a housing, a terminal accommodation chamber which extends through the housing, a terminal within the chamber and a closure plug for one end aperture of the chamber, said plug being integral with said terminal, and wherein said device comprises a frame having a position setting surface defining a pre-determined inspection position of a housing of an electrical connector, a stopping member movable with respect to the frame to hold said housing in said inspection position, and a pressing member of one of the frame and stopping members, the pressing member being adapted for abutment with a closure plug of the housing so as to press the plug into the housing as the housing is moved into said pre-determined position in use.

In this way the closure plug can be pressed from a semi-filled condition into the correct position, and since the plug and terminal are functionally integral, the terminal is also inserted correctly.

Preferably the device includes lever means to move the stopping member relative thereto, the lever means including an over centre mechanism to lock the frame and stopping member at a predetermined separation distance.

In a preferred embodiment a plurality of semi-circular pressing members are provided.

The inspection device may include a projection detector member for contact with a terminal of the connector, the detector being outwardly biased by resilient means such as a coil spring. Such a detector can exert a predetermined force according to the rate and pre-load of the spring. A plurality of detector members may be provided, and one or more such detector members may be electrically conductive in order to determine the electrical integrity of the respective terminal in addition to the mechanical fixing thereof.

The inspection device may include a pushing member for contact with a housing or retainer of a connector, the pushing member being outwardly biased by resilient means such as a coil spring. In such a case biasing loads are taken by the housing or retainer and not by an electrical terminal. A plurality of such pushing members may be provided.

BRIEF DESCRIPTION OF THE DRAWINGS

Other features of the invention will be apparent from the following description of several preferred embodiments shown by way of example only with reference to the accompanying drawings in which:

FIGS. 15a–15c illustrate operation of a detector for sensing correct installation of a terminal.

Description of the Preferred Embodiments

A first embodiment relating to a waterproof connector of what is known as the lance type, which does not have a retainer, is discussed first with reference to FIG. 1 to FIG. 7.

Figure 1:
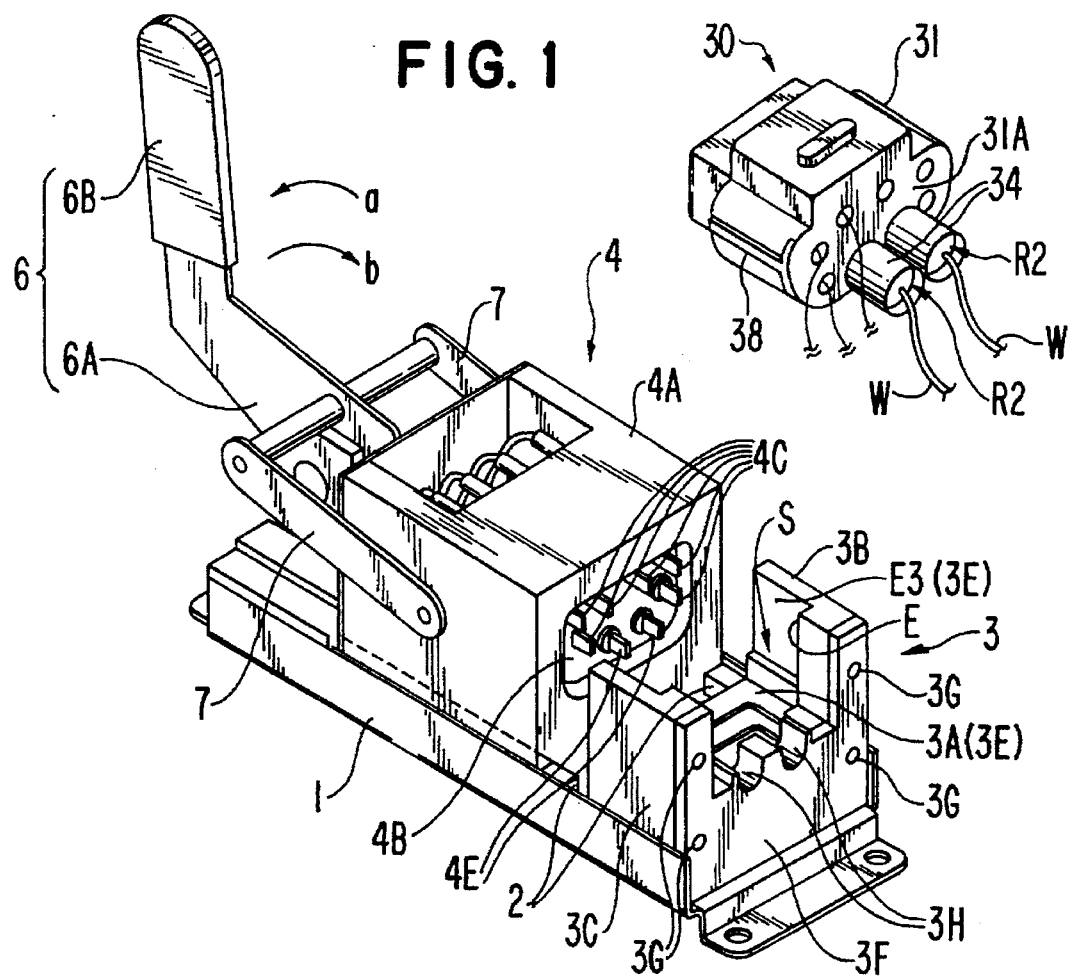
FIG. 1 is an oblique view illustrating the configuration of the inspection device for a waterproof connector according to one embodiment of the present invention.

FIG. 1 is an oblique view illustrating the configuration of an inspection device for waterproof connectors according to the first embodiment. The inspection device is used, for example, to inspect connectors attached to a wire harness. The wire harness is inspected after being placed on an inspection table on which the wiring connections have been marked in advance. An inspection device for waterproof connectors shown in FIG. 1 is fixed in each location in which a connector of the wire harness placed on the inspection table is to be positioned.

Figure 2:
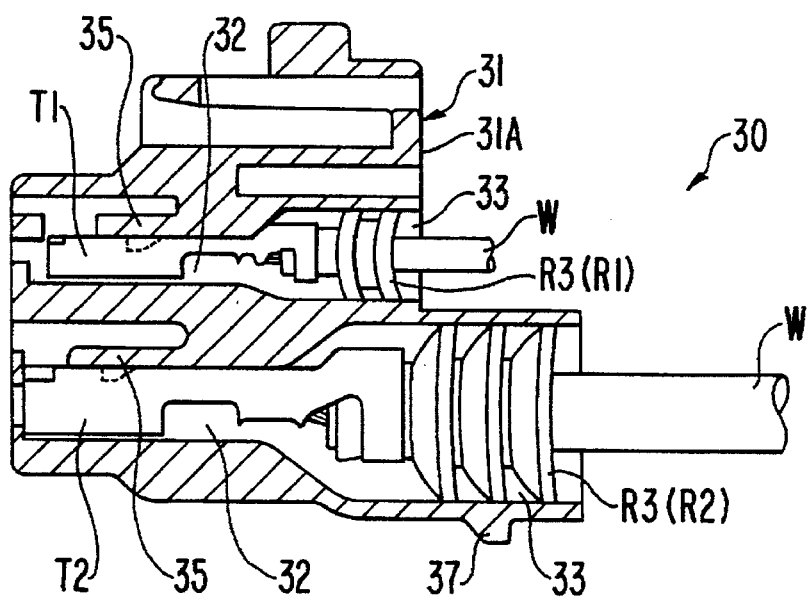
FIG. 2 is a cross-section of a connector to be inspected by the first embodiment.

Referring to FIG. 1 and FIG. 2, the waterproof connector 30 which is the subject of the present embodiment has a housing 31 made of resin. The inside of the housing 31 is hollow, and is divided into terminal-accommodation chambers 32 for accommodating terminals T1 and T2, and insertion side openings 33 contiguous with the terminal-accommodation chambers 32, for inserting terminals T1 and T2 into these terminal-accommodating chambers 32. The insertion side openings 33 are formed with larger diameters than the terminal-accommodation chambers 32.

The above-mentioned terminals T1 and T2 are what are known as crimped terminals, which are crimped to the ends of electrical wires w. The terminals T1 and T2 are sealed on the insulated ends of the above-mentioned electrical wire w via waterproof plugs R1 and R2 made of rubber. The waterproof plugs R1 and R2 are integrally provided with flanges R3 which seal the insertion side openings, upon insertion of the terminals as shown in the figures. The connector 30 of the present embodiment has small-diameter terminals T1 sealed by relatively small-diameter waterproof plugs R1, and large-diameter terminals T2 sealed by large-diameter waterproof plugs R2. The waterproof plugs R2 formed integrally with the above-mentioned large-diameter terminals T2 are accommodated inside cylindrical portions 34 provided extending from the housing 31, which is to say inside the insertion side openings 33.

In order to fix the terminals T1 and T2 in the terminal-accommodation chambers 32, lances 35 are integrally formed in the housing 31, the free ends of which are inclined in such a way as to project into the terminal-accommodation chambers 32 from the upstream side to the downstream side in the direction in which the terminals are inserted. The above-mentioned terminals T1 and T2 are secured in the housing 31 by the urging force of these respective lances.

Position-setting ribs 37 which extend in a direction orthogonal to the terminals T1 and T2 project from the bottom surface of the above-mentioned cylindrical portions 34 of the housing 31. Furthermore, approximately T-shaped position-setting ribs 38 (only shown in FIG. 1) project on either side of the housing 31. The ribs 37 and 38 are formed at right angles to each other, thereby facilitating the position-setting of the housing 31.

Referring next to FIG. 1, the inspection device of the present embodiment has a base 1 to be secured to the inspection table. The base 1 is a metal member formed with a rectangular shape in plan view, and is integrally equipped with a pair of rail members 2 extending in the length direction. The end surface at one end of each of the rail members 2 faces a connector-receiving portion 3 which receives the housing 31 of the connector 30 to be inspected. Furthermore, an inspection portion 4 is arranged with freedom to slide on top of the rail members 2, which rail members 2 constitute a displacement means permitting the inspection portion 4 to approach or recede from the connector-receiving portion 3.

The above-mentioned connector-receiving portion 3 is a moulded resin component provided with a base 3A secured to one end of the above-mentioned base 1 by means of a bolt which is not shown, and provided with a pair of side portions 3B and 3C extending upwards from the two edges of the base 3A in its width direction, as illustrated.

Figure 3:
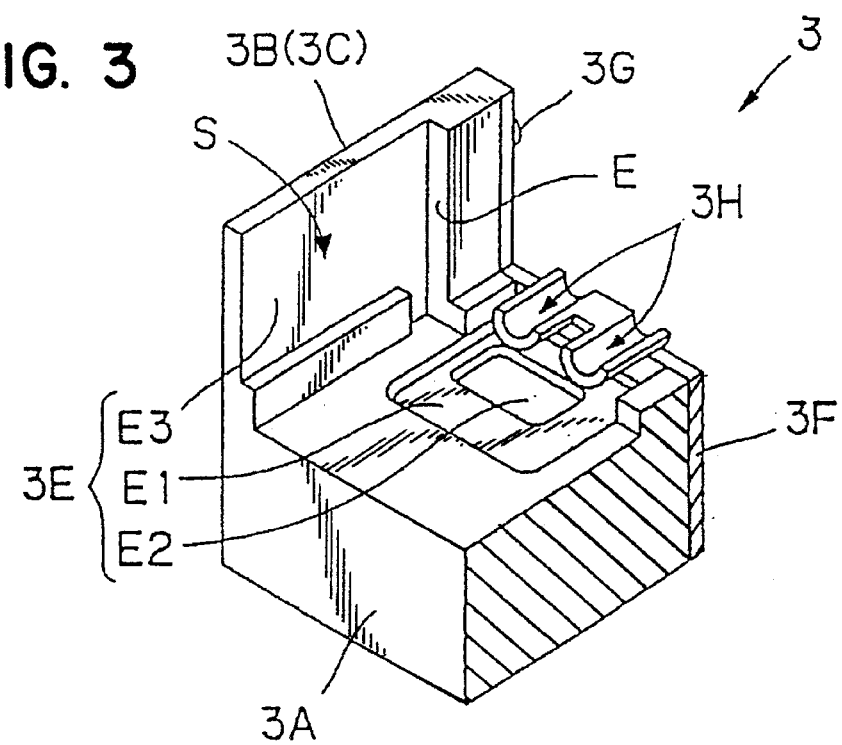
FIG. 3 is an oblique view in which part of the connector-receiving portion of the first embodiment has been sectioned.

Referring to FIG. 3, the base 3A and the two side portions 3B and 3C together form a U-shape the inside of which forms a guide surface 3E into which the housing 31 of the above-mentioned connector 30 can be inserted from the top.

The guide surface 3E is contiguous with a position-setting surface E which receives the terminal insertion side end surface 31A (see FIG. 1) of the housing 31. This position-setting surface E is delineated by roughly L-shaped shoulders formed on the base 3A and the two side portions 3B and 3C.

In order to guide the housing 31 to the position-setting surface E, the guide surface 3E is provided with a first recess E1 formed in the top surface of the base 3A, a second recess E2 formed in the first recess, and with guide surfaces E3 formed on the inner surfaces of the side portions 3B and 3C. The above-mentioned first and second recesses E1 and E2 guide the ribs 37 of the housing 31, the guide surfaces E3 guide the above-mentioned ribs 38 as will be discussed hereinbelow, and the said recesses E1 E2 and surfaces E3 are intended to guide the insertion side edge surface 31A of the housing 31 to the position-setting surface E. These first and second recesses E1 and E2 and the guide surfaces E3, together with the above-mentioned position-setting surface E delineate an accommodation space S for accommodating the housing 31.

As shown in FIG. 1, screws 3G are used to secure an attachment plate 3F to the end surface of the connector receiving portion 3. The plate 3F is roughly U-shaped, and follows the cross-section of the base 3A and two side portions 3B and 3C. A pair of pressing pieces 3H formed roughly in the shape of half cylinders are provided extending from the attachment plate 3F. The pressing pieces 3H project in use towards the insides of the cylindrical portions 34 of the housing 31 when it has been placed at the position-setting surface E, and are intended to ensure that the waterproof plugs R1 and R2 sealing the insides of the cylindrical portions 34 are in the proper position.

Turning now to the inspection portion 4, this is provided with a main body 4A made of resin mounted on the above-mentioned rail members 2. The main body 4A is linked to a handle 6 pivotally supported at the other end of the above-mentioned base I via a pair of link arms 7. The handle 6 is provided with a base end portion 6A which is able to pivot around an axis orthogonal to the above-mentioned rail members 2, and with a grip portion 6B contiguous to the base end portion 6A. At one end, the above-mentioned link arms 7 are pivotally supported by the base end portion 6A, and the other ends of the link arms 7 are pivotally supported by the main body 4A. This makes it possible to displace the main body 4A so that it can approach or recede from the connector-receiving portion 3 by pivoting the handle 6 about the above-mentioned axis. It should be noted that the handle 6, link arms 7 and the connector-receiving portion 3 comprise a toggle mechanism acting as a lock means, and they are constructed in such away that, if the main body 4A is moved towards the connector-receiving portion 3 and brought into contact therewith, the handle 6 is pivoted in the approaching direction and passes beyond a dead point (over centre) to lock the main body against the connector-receiving portion 3.

Figure 6:
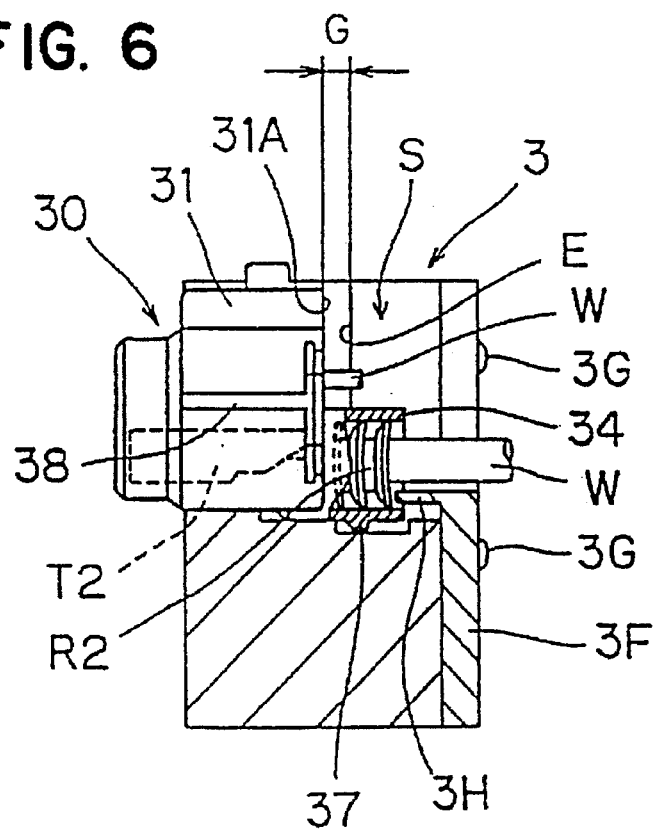
FIG. 6 is a cross-section illustrating the process of installing the connector in the connector-receiving portion of FIG. 3.
Figure 7:
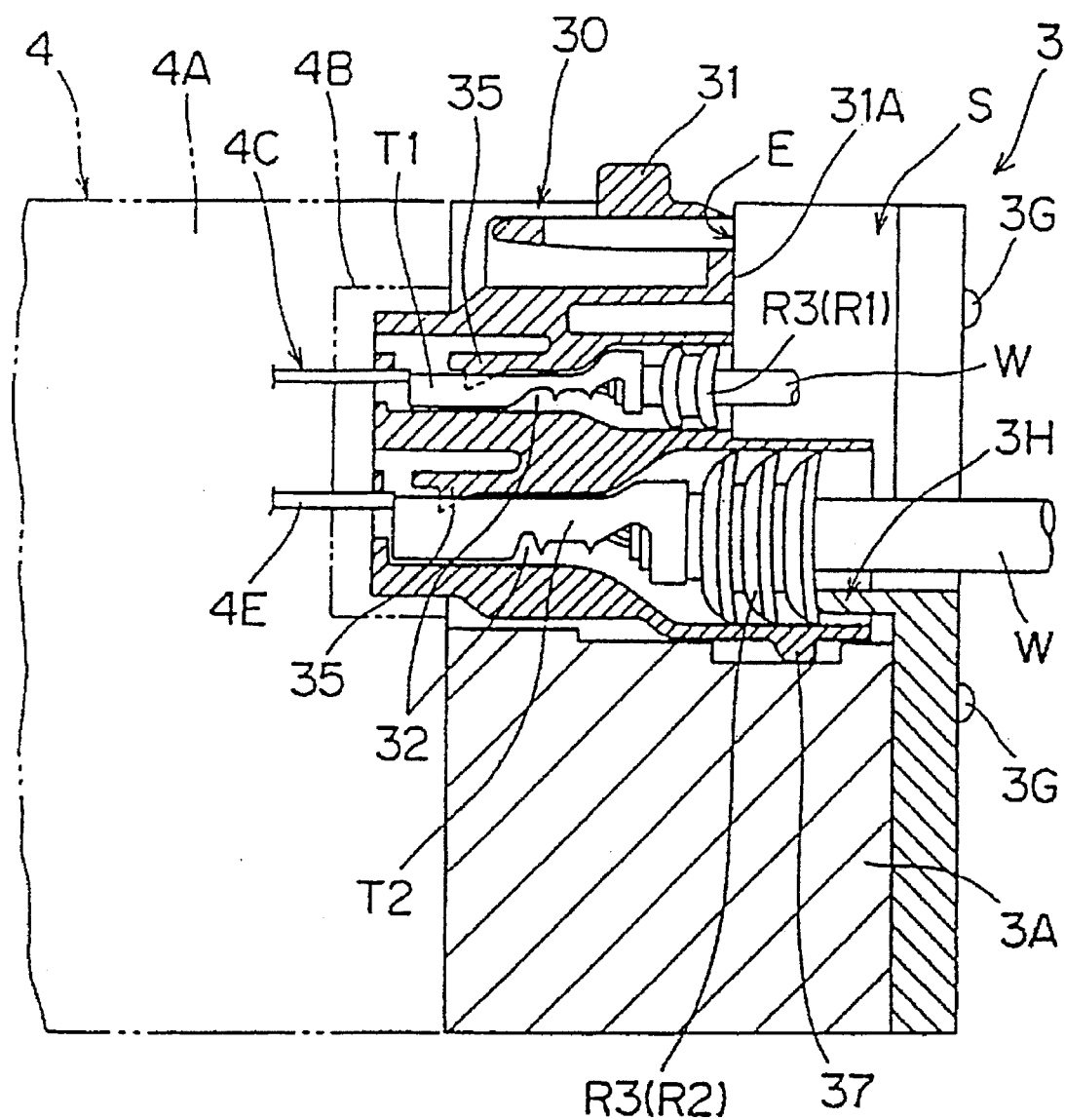
FIG. 7 is a cross-section illustrating the connector installed in the connector-receiving portion of FIG. 3.

Referring to FIG. 7, a recess 4B is formed in the main body 4A facing the connector-receiving portion 3. The inside of the recess 4B is provided with a plurality of detectors 4C and 4E projecting towards the connector-receiving portion 3. The detectors 4C and 4E correspond respectively to the terminals T1 and T2 of the connector 30 to be inspected, and are known items which are able to touch the corresponding terminals T1 and T2 from the connection side of connector 30 set in position at the position-setting surface E. Of the detectors 4C and 4E, those associated with the small-diameter terminals T1 (the detectors 4C in the present embodiment) have an arrangement whereby inspection of the mechanical connection and inspection of the electrical integrity are carried out simultaneously, and they are urged in the direction of the connector-receiving portion 3 by compression coil springs, for example at a force of 2 kgf. When a terminal T1 is properly fitted in the housing 31, a detector 4C acts against the urging force of the urging member, is pushed in the terminal insertion direction, and is able to detect correct placement. If a terminal T1 is not inserted in the housing 31, or is in a semi-fitted state, the detector 4C projects towards the terminal accommodation chamber due to the urging force of the above-mentioned urging member, and the defect in the connector can be detected. As discussed hereinbelow, in the first embodiment shown in FIG. 1 to FIG. 7, the detectors 4C associated with the terminals T1 double as stopping members which act together with the position-setting surface E to hold the housing 31 in the inspection position.

In contrast, those detectors corresponding to the large-diameter terminals T2 (the detectors 4E in the present embodiment) are of as type which only carry out the inspection for electrical integrity, and they are urged in the direction of the connector-receiving portion 3 by a compression coil spring, which is not depicted, under an urging force which is relatively weak compared to the detectors 4C.

The action of the above-mentioned embodiment is described.

Figure 4:
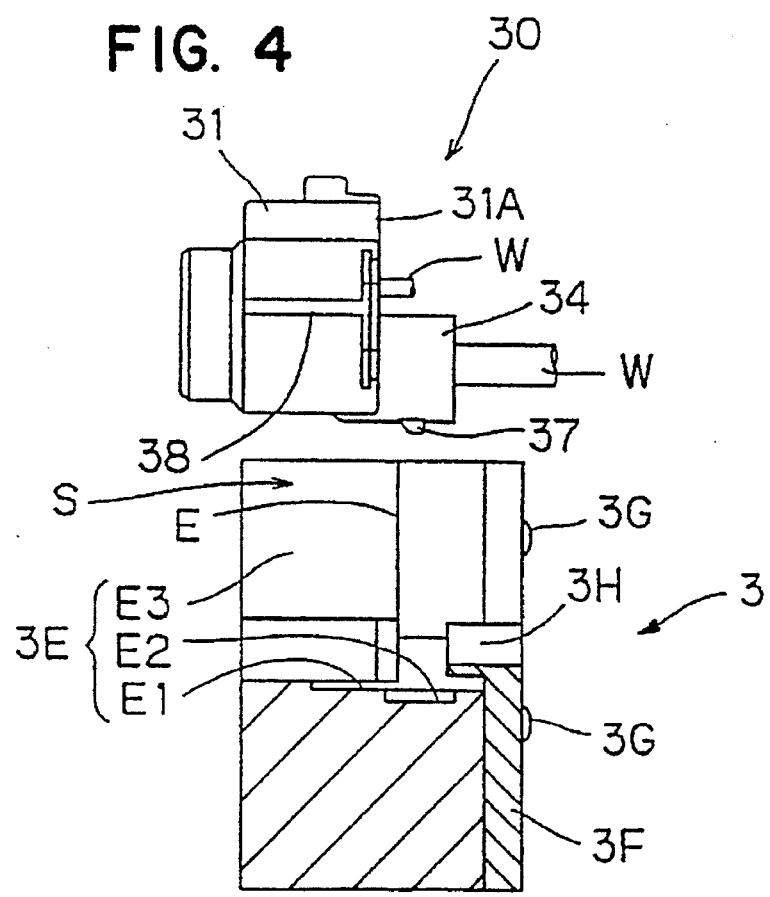
FIG. 4 is a cut-away view illustrating the cross-section of the connector-receiving portion and connector of FIG. 3.
Figure 5:
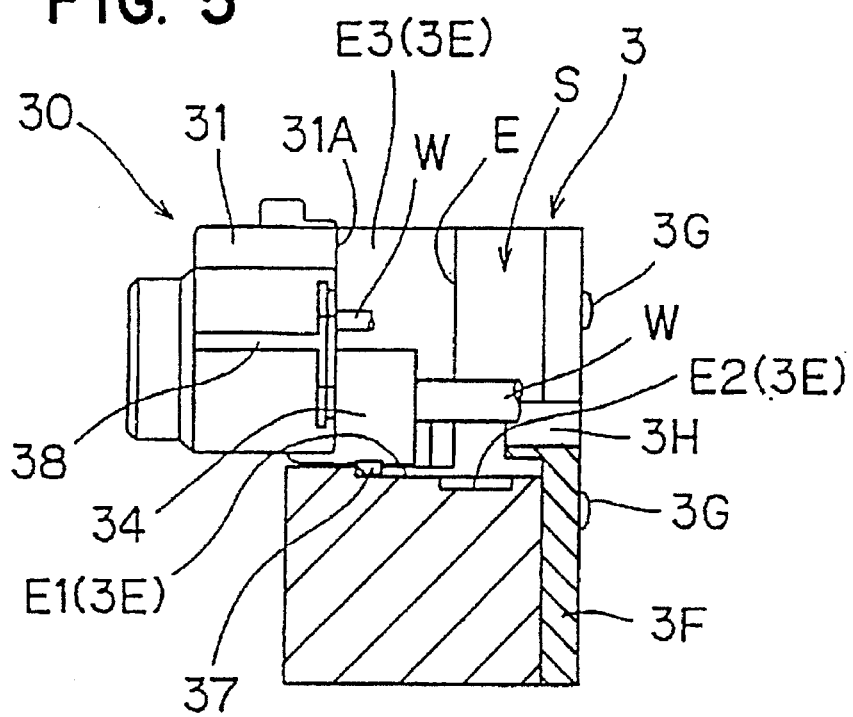
FIG. 5 is a cross-section illustrating the process of installing the connector in the connector-receiving portion of FIG. 3.

Firstly, in the initial state shown in FIG. 1, the handle 6 is turned in the outward direction, and the main body 4A of the inspection portion 4 is separated from the connector-receiving portion 3. As shown in FIG. 4, in this state the connector 30 is lowered from above facing the guide surface 3E of the connector-receiving portion 3, while the ribs 38 formed on both sides of the housing 32 follow the guide surfaces E3. As shown in FIG. 5, the ribs 37 of the housing 31 catch on the first recess E1. In this state, if the housing 31 is pushed inwards towards the position-setting surface E, then, as shown in FIG. 6, the ribs 37 fall into the second recess E2, the lower surfaces of the cylinder portions 34 being received by the first recess E1, and the front end surfaces of the pressing pieces 3H come to face the end surfaces of the large-diameter waterproof plugs R2. Then, if the terminals T2 are completely fitted and the waterproof plugs R2 are thus in the desired sealing positions, the insertion side end surface 31A of the housing 31 comes into contact with the position-setting surface E and the housing 31 comes to be positioned in the inspection position. In contrast, if a terminal T2 of the connector 30 is semi fitted, then, as shown in FIG. 6, the waterproof plug R2 is in a partially inserted condition. As a result the insertion side end surface 31A and the above-mentioned position-setting surface E face each other with a gap G.

If the handle (refer to FIG. 1) is turned from the state in FIG. 6 in the inward direction (clockwise in FIG. 1), then, as shown in FIG. 7, the main body 4A of the inspection portion 4 contacts with the housing 31 held in the connector-receiving portion 3, and is locked by the toggle mechanism constituted by the connector-receiving portion 3, the link arms 7 and the handle 6.

The following action is carried out on the large-diameter terminal piece T2 where semi-fitting is a problem.

To elaborate, when the semi-fitted connector 30 as described above is sandwiched under pressure between the detectors 4C and the position-setting surface E of the present embodiment, the urging force of the detectors 4C is transmitted from the corresponding small-diameter terminal T1, via the lances 35, to the housing 31 of the connector 30. Thus, the housing 31 is displaced to the right in FIG. 7 by the amount of the gap G shown in FIG. 6 by the urging force from the above-mentioned detectors 4C. On this occasion, because the pressing piece 3H abuts against the waterproof plug R2 before the housing 31 begins to be displaced, the waterproof plug R2 is held against outward movement. Thus, the housing 31 and the waterproof plug R2 are displaced relative to one another and the pressing piece 3H pushes the waterproof plug R2 in the direction of insertion of the terminal T2. The force with which it is pushed in is transmitted via the waterproof plug R2 to the terminal T2, and the terminal T2 is pushed in from the semi-fitted state to the correct insertion position inside the terminal-accommodation chamber 32. After this, the position of the terminals T2 is inspected by the above-mentioned detectors 4E. In contrast to this, with the above-mentioned small-diameter terminal pieces T1, the mechanical fixing and the electrical integrity are inspected by the respective corresponding detectors 4C.

In this way, with the configuration of the present embodiment, because the pressing pieces 3H are formed integrally with the position-setting end of the connector-receiving portion 3 displaced relative to the housing 31, when a terminal T2 of the connector 30 is semi fitted, a pressing piece 3H acts via the waterproof plug R2 to push the terminal T2 into the proper position, and it is then possible to inspect the position of the terminal T2. As a result, semi-fitting is avoided in the inspection process, and thus there is a marked advantage that semi-fitting can be reliably prevented from being detected at a later stage.

With the configuration of the present embodiment, because the detectors 4C are supported integrally with the detectors 4E which are able to detect electronic integrity of the terminals T2 by means of the main body 4A, it follows that in the process of holding the housing 31 at the position-setting surface E, the detectors can touch the terminals T2 inside the housing 31, with the resulting advantage that the inspection can be carried out efficiently.

Furthermore, because the detectors 4C double as stopping members holding the connector 30 at the position-setting surface E at the time of inspection, there is the advantage that the configuration can be made all the more simple.

Figure 8:
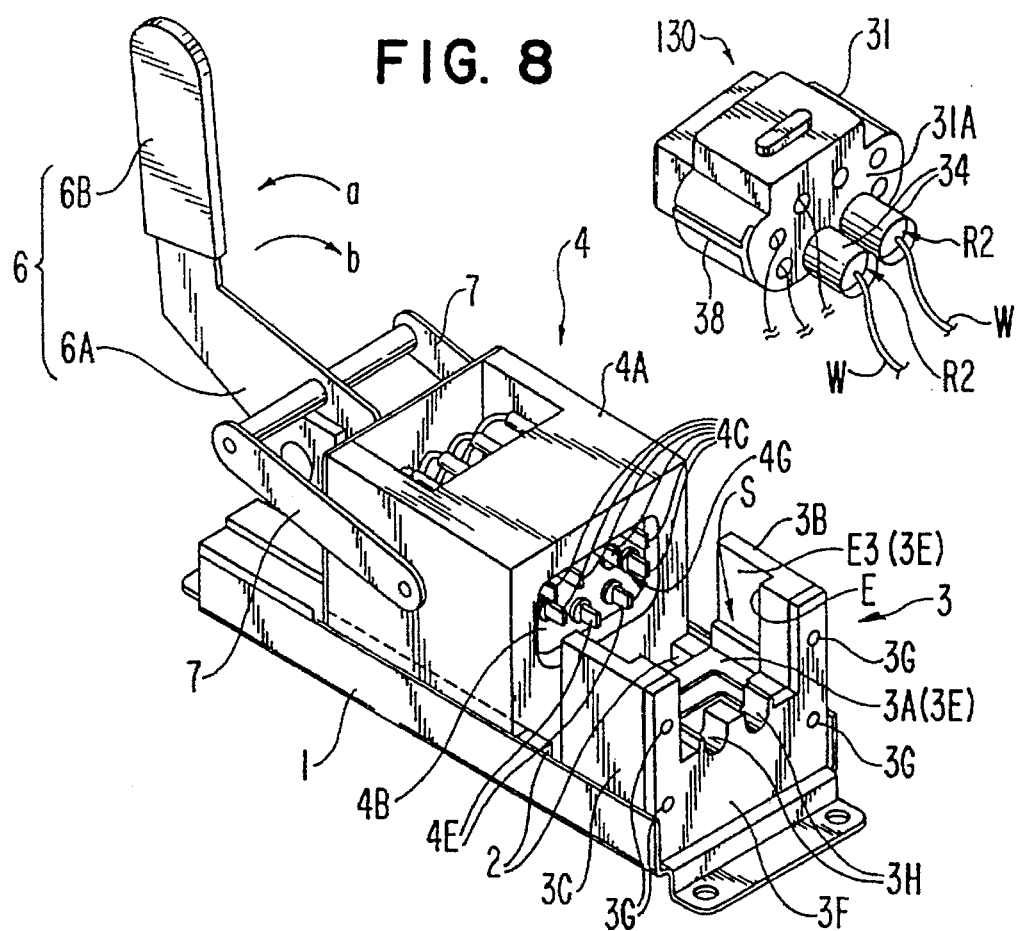
FIG. 8 is an oblique view illustrating the configuration of an inspection device for a waterproof connector according to another embodiment of the present invention.
Figure 9:
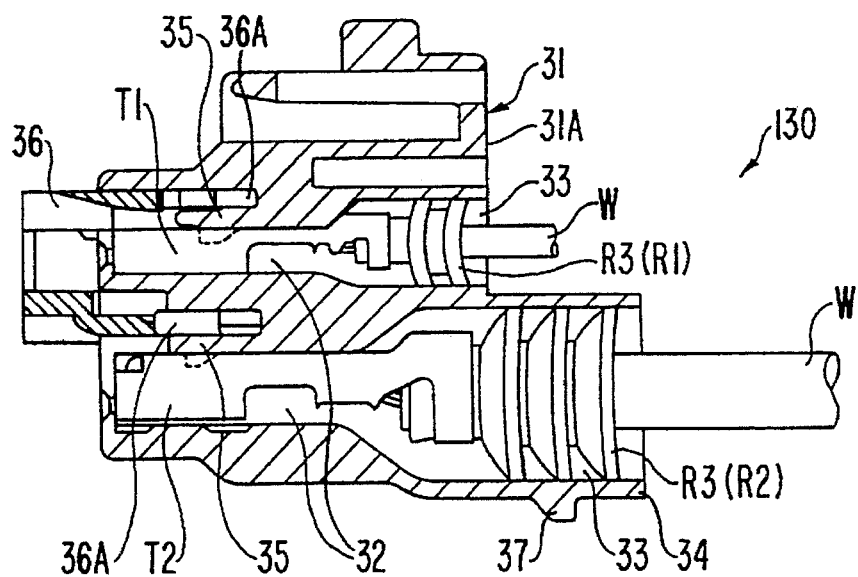
FIG. 9 is a cross-section in a connector to be inspected by the embodiment of FIG. 8.
Figure 10:
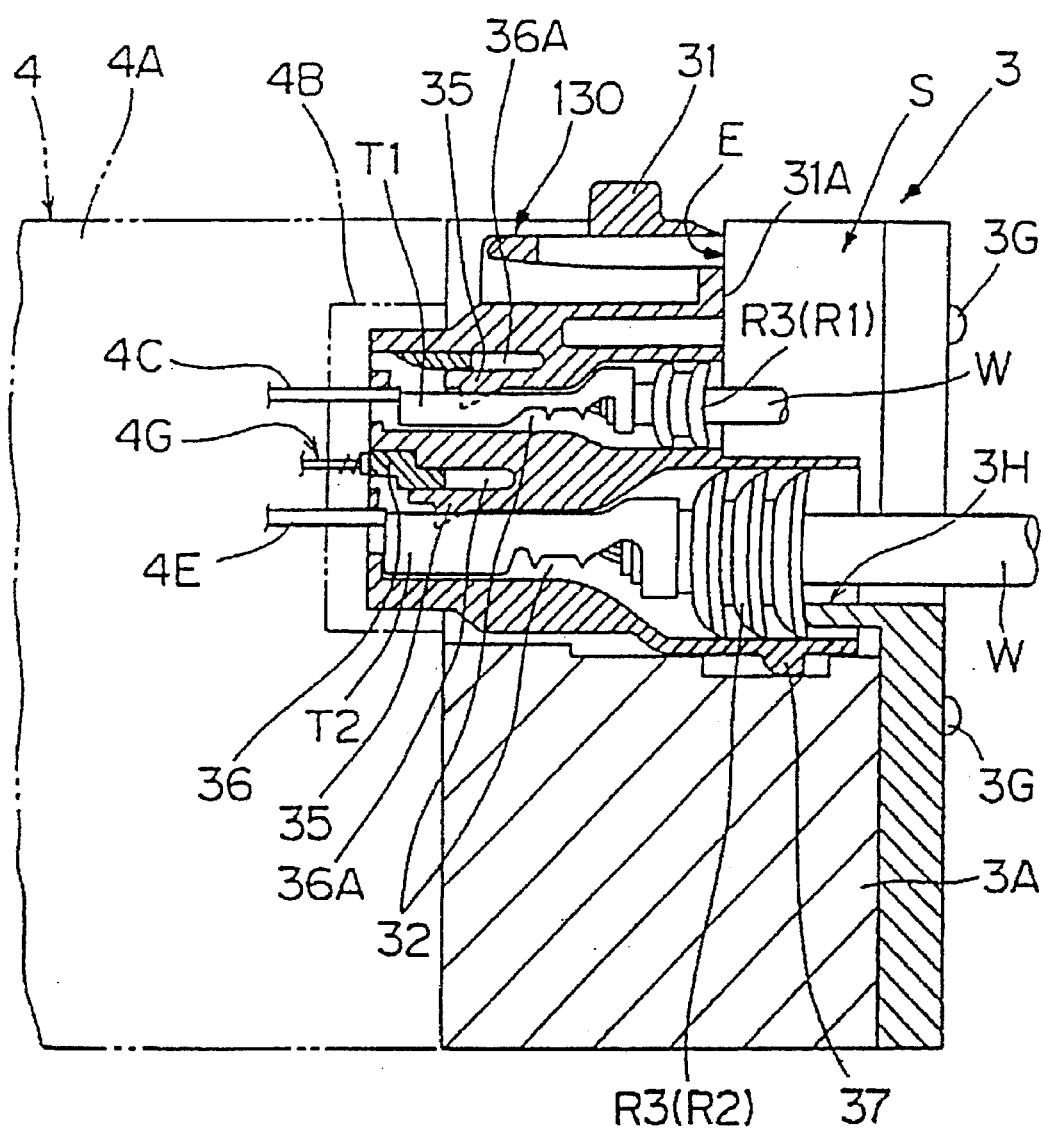
FIG. 10 is a cross-section illustrating the connector installed in the connector-receiving portion in the embodiment of FIG. 8.

A second embodiment shown in FIGS. 8 to 10 is now described in detail.

Referring first to FIG. 9, the connector 130 according to the second embodiment has what may be termed a dual arrest format. The housing 31 is integrally provided with lances 35 for holding the terminal pieces T1 and T2, like the connector 30 described in FIG. 2. The upper surfaces of the lances 35 (the surfaces on the sides opposite the terminals T1 and T2) open to the outside from the introduction holes 36A formed in the surface on the connection side of the housing 31, and a retainer 36 consisting of a different member to the housing 31 is inserted in the introduction hole 36A (in FIG. 9 the retainer is 36 in a partially inserted state). The retainer 36 acts to detect the engagement state of the lances 35 on the terminals T1 and T2. More specifically, when the lances 35 have correctly engaged the terminals T1 and T2, the above-mentioned introduction hole 36A is open, and therefore the retainer 36 is in the same plane as the end surface of the housing 31. In contrast, when the lance 35 has not correctly engaged a terminal, the lance 35 sticks out in the introduction hole 36A. Thus, when the retainer 36 is introduced into the introduction hole 36A, the lance 35 and the retainer 36 interfere with each other and the retained 36 cannot be completely inserted. Consequently, the person operating the device can check the engagement state of the lances 35 on the terminals T1 and T2 by whether the retainer 36 is fully inserted.

Referring to FIG. 8, in order to detect the presence or absence of the above-mentioned retainer 36, a detection switch 4G having, for example, a spring pressure of 300 g force for 2 mm movement is also provided in the recess 4B of the main body 4A.

Referring to FIG. 10, the housing 31 and waterproof plug R2 can be displaced relative to each other in the second embodiment as well, and the pressing piece 3H can push the waterproof plug R2 in the direction of insertion of the terminal T2. The pushing force is transmitted via the waterproof plug R2 to the terminal T2, which is pushed in the insertion direction from the semi-fitted state to the proper insertion position. Then, as in the first embodiment, the terminal pieces are inspected by the above-mentioned detectors 4C and 4E.

Thus the second embodiment also presents the same operating advantages as the first embodiment in that it is able to correct a semi-fitted terminal T2 at the time of inspection, and in that the housing 31 and the detectors 4C and 4E contact the terminals T1 and T2. Furthermore, the provision of the detection switch 4G discussed above makes it possible to prevent installation oversights by detecting the presence or absence of the retainer 36.

Figure 11:
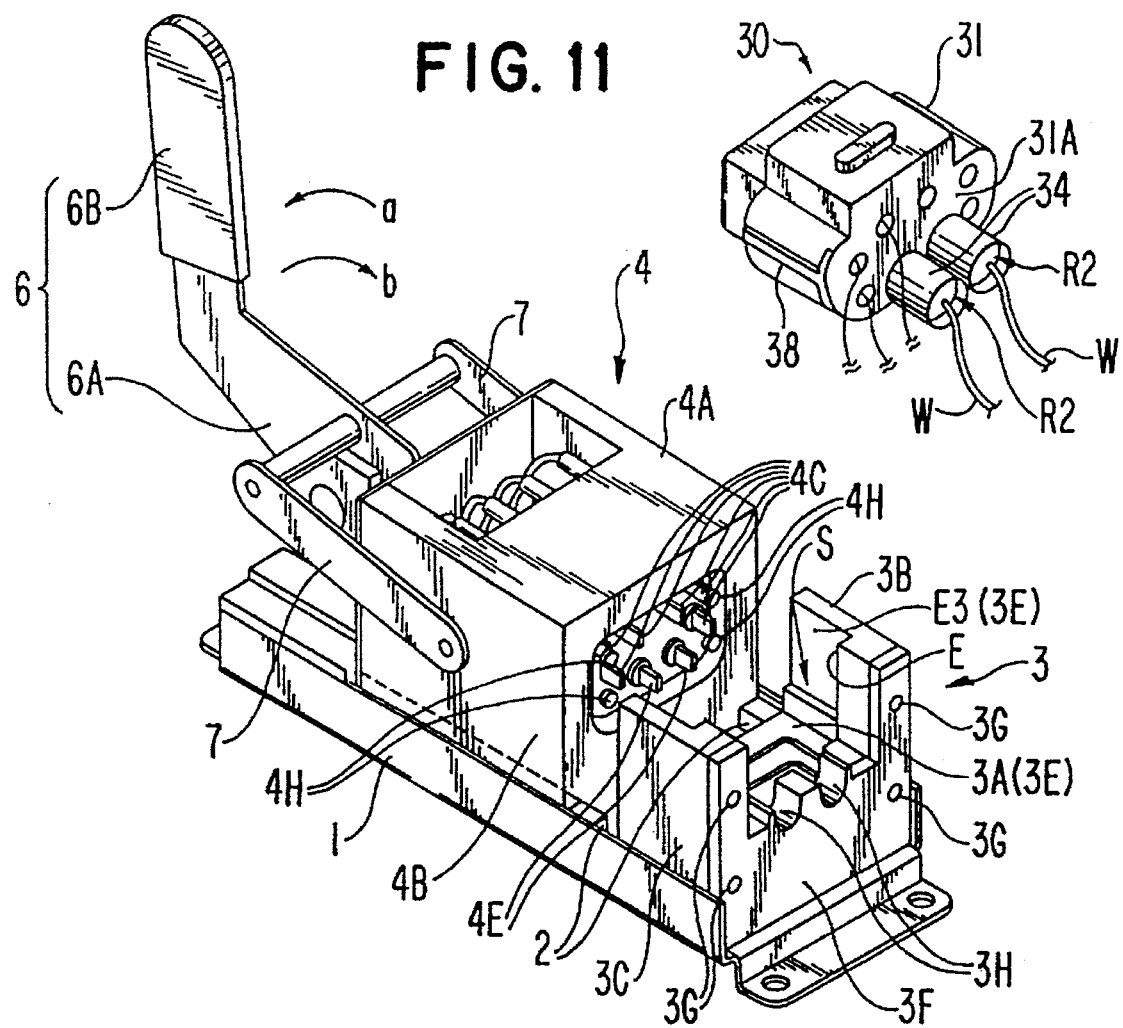
FIG. 11 is an oblique view illustrating the configuration of the inspecting device for a waterproof connector of a third embodiment of the present invention.
Figure 12:
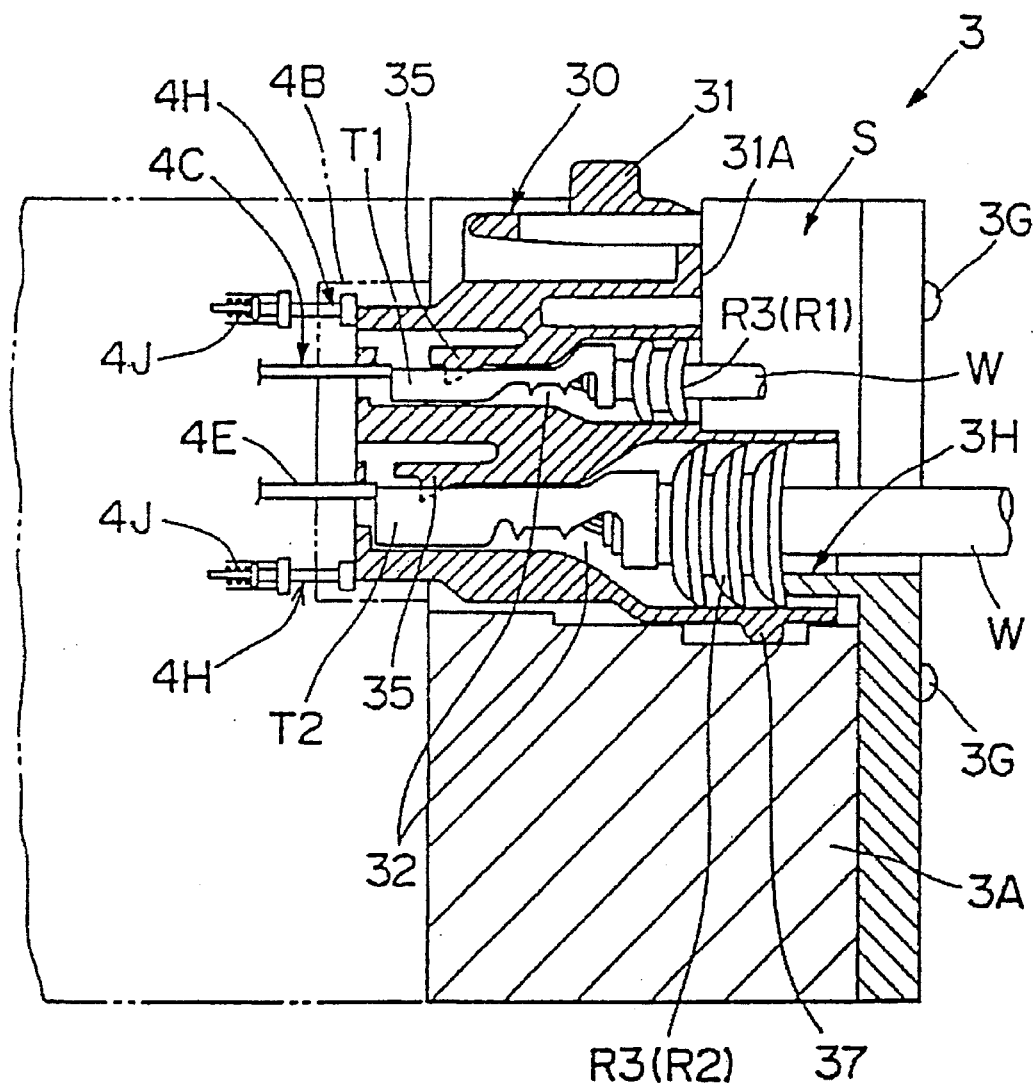
FIG. 12 is a cross-section of the connector to be inspected by the embodiment of FIG. 11.

A third embodiment shown in FIG. 11 and FIG. 12 is described in detail below.

A characterising feature of the third embodiment is that it is also provided with pressing elements 4H in the inspection portion 4 of the first embodiment 1 described above.

More specifically, the pressing elements 4H are provided in the four corners of the recess 4B formed in a rectangle, and extend parallel to the detectors 4C and 4E.

As the main body 4A approaches the connector-receiving portion 3, the pressing elements 4H press the housing 31 of the connector 30 against the position-setting surface E, thereby acting with the position-setting surface E to hold the housing 31 in the inspection position.

Referring to FIG. 12, in order to achieve such an action, the pressing elements 4H are arranged in such a way that they are urged towards the connector-receiving portion 3 by means of compression coil springs 4J provided compressed inside the main body 4A; when a predetermined load acts on the front edge, the elements 4H are displaced inwards in opposition to the spring force of the coil springs 4J. The urging forces of the compression coil springs 4J are respectively set at 2 kg force for 2 mm movement.

In the third embodiment, when a semi-fitted connector 30 is sandwiched under pressure between the pressing elements 4H and the position-setting surface E and held in the inspection position, the housing 31 of the connector 30 is displaced to the right in FIG. 12 by the amount of the gap in the said semi-fitted state (the gap G shown in FIG. 6), under the urging force of the pressing elements 4H. On this occasion, because the pressing piece 3H abuts against the waterproof plug R2 before the housing 31 begins to the displaced, the waterproof plug R2 is prevented from moving outwardly. Therefore, the housing 31 and the waterproof plug R2 are displaced relative to one another and the pressing piece 3H pushes the waterproof plug R2 in the direction of insertion of the terminal T2. The force with which it is pushed in is transmitted via the waterproof plug R2 to the terminal which is pushed in from the semi-fitted state to the proper insertion position. After this, the terminal is inspected by the above-mentioned detectors 4C and 4E as in the first embodiment.

Thus the third embodiment also gives the same operating advantages as the first and second embodiments, but is also provided with the pressing elements 4H, which give a desired pushing-in load. In other words, when the housing 31 is displaced relative to the pressing pieces 3H under only the load of the detectors 4C as in the first embodiment, the number of terminals T1 pressed by the detectors 4C is not constant depending on the type of product, and in articles with few electrodes as well as in articles where the spring pressure of the detectors 4C is low, it may not be possible to obtain the load required to correct the position of a large-diameter terminal T2. In particular, because the spring pressure is limited to the range within which it does not deform the terminals, it may be difficult to obtain a sufficient thrust. In contrast, when pressing elements 4H are provided as in the present embodiment, a substantial load can be brought to act on the housing 31, and therefore, even with few electrodes and where the spring pressure of the detectors 4C is low, the position of the terminal T2 can be reliably corrected, and there is no risk that the terminals T1 will be damaged.

Figure 13:
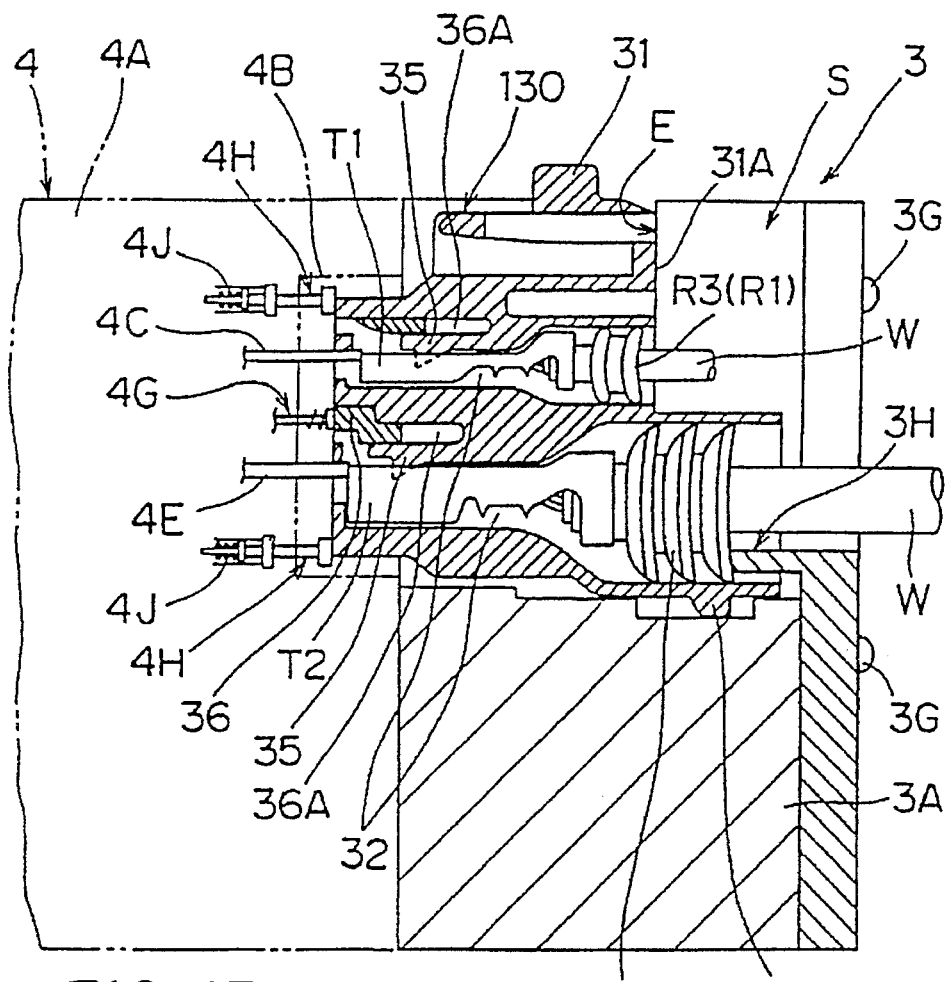
FIG. 13 is a cross-section of the connector installed in the connector-receiving portion of a fourth embodiment of the present invention.

This advantage is even more pronounced in the fourth embodiment shown in FIG. 13.

The fourth embodiment shown in FIG. 13 is an example in which the pressing elements 4H have also been provided in the inspection device of the second embodiment.

Referring to this figure, when the retainer 36 is also provided in the housing 31, it is possible to use the retainer 36 itself to detect the state of engagement of the lances 35. However it is not possible to detect the semi-fitted state from the external appearance and the lance 35 becomes more difficult to displace with the result that the terminal T2 becomes difficult to move to the proper position due to the frictioned force of the lance 35. In such a case, the terminal T2 can be reliably engaged by the pressing piece 3H by providing the above-mentioned pressing elements 4H and bringing a substantial load to act on the housing 31.

Figure 14:
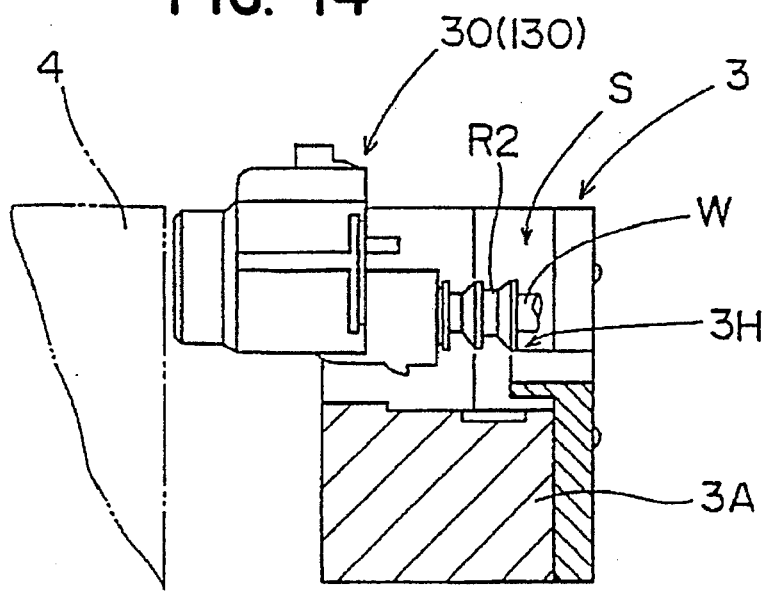
FIG. 14 is a cross-section illustrating the action of the connector-receiving portion used in the embodiments of the present invention.

The embodiments discussed above were described with the waterproof plug R2 accommodated completely inside the housing 31. In contrast, there are also cases in which the waterproof plug R2 projects from the housing 31 as shown in FIG. 14. If an attempt is made to install such a housing 31 in the above-mentioned connector-receiving portion 3, the above-mentioned pressing piece 3H engages the projecting waterproof plug R2, and the housing 31 is not able to be accommodated in the housing accommodation space S of the connector-receiving portion 3. Thus, in the embodiments discussed above, if it is attempted to install a housing from which the waterproof plug R2 is protruding, the pressing piece 3H mechanically obstructs the housing 31 from being accommodated in the accommodation space, so that there is the advantage that it is also possible to detect imperfect installation of the terminal pieces and waterproof plug R2 in the housing 31.

The embodiments discussed above are no more than preferred embodiments of the present invention and the present invention is not limited to the above-mentioned embodiments.

For example, a configuration may also be adopted which is capable of correcting the insertion positions of all the terminals T1 and T2 by providing, in the third and fourth embodiments discussed above, pressing pieces which press the small-diameter waterproof plugs R1. In this case, it is not necessary to perform the correcting operation on the insertion positions of the terminals again, and thus there are the advantages that production operations are greatly reduced and the product yield is also high. Furthermore, because the terminals are corrected, there is the advantage that there is no need to provide members for detecting semi-fitting of terminal pieces, and the mechanism required for the inspection is simplified.

The above-mentioned detectors 4E are attached to the member (the main body 4A) which can be displaced relative to the position-setting surface E, but a configuration may also be adopted in which the detectors project from the position-setting surface as in the inspecting device disclosed in Laid-Open Japanese Utility Model Sho. 57-89964. When such a configuration is adopted, the present invention can be implemented by providing a stopping member such as a toggle crank which pushes the housing against the position-setting surface, and providing a pressing piece on the toggle crank. Thus the pressing piece can be attached to either the position-setting surface or the stopping member.

The present embodiments adopt a format in which the connector-receiving portion 3 carrying the connector 30 is fixed and the main body 4A of the inspection portion 4 moves, but the present invention may also be applied to a device of a format in which the connector-receiving portion 3 is made to approach or recede from the main body 4A.

FIGS. 15a–15c illustrate operation of a suitable detector for sensing correct installation of a terminal T2. The connector 30 corresponds to that shown for example in FIG. 7, and the common parts are given the same reference numerals.

The movable main body 4A is generally indicated by the cross-hatched blocks 4M which house a detector assembly 100.

The detector assembly 100 comprises a probe 101 slidable in a bore of the main body 4M, and projecting towards the connector 30. The probe has a shoulder 102, intermediate its ends, and a coil spring 103 is provided between the shoulder 102 and the main body 4M so as to resiliently resist inward movement of the probe. The probe is provided with a sleeve bearing 104.

A rod-like switch member 105 is provided in the bore of the main body and is also slidable back and forth; the switch member 105 and probe 101 have a common longitudinal axis. A tube 107 is provided between the switch member 105 and the main body 4M, and the switch member has radially extending bearing portions 108 to reduce sliding friction in the tube. The tube 107 extends rearwardly of the switch member to house a coiled compression spring 109 which resiliently resists rearward movement of the switch member 105. The tube 107 is mounted in the main body in any convenient manner. In use the probe 101 and switch member 105 constitute the two parts of an electrical switch, and when in contact they permit current to pass. Electrical connections may be made in any suitable manner and likewise attention must be paid to ensuring electrical isolation of the components from each other.

The initial condition of the detector assembly is that the switch member 105 and probe 101 are spaced apart by virtue of spring 103.

FIG. 15a illustrates what happens when the main body 4M is moved towards a connector engaged in the connector receiving portion 3. The probe 101 contacts the terminal T2 which resists being pushed relative to the connector body since the lance 35 is correctly engaged. Accordingly the probe 101 moves inwardly of the main body to make electrical contact with the switch member 105, thus completing an electrical circuit to indicate that the terminal is correctly installed.

FIG. 15b illustrates the condition where a false positive signal may be given by the detector 100. In this case the frictional resistance of the waterproof plug 122 is sufficient to overcome the force of the spring 103 notwithstanding that the lance is not fully engaged.

FIG. 15c illustrates that without the waterproof plug R2 an incorrectly installed terminal will be pushed out of the connector housing and the separation of the switch member 105 and the probe 101 will be maintained, thus preventing completion of the electrical detection circuit.

By the use of the present invention, correct insertion of the waterproof plug R2 is ensured, and thus a false positive signal can be avoided. The detector assembly can thus be used with confidence to check for mechanical and electrical integrity of the connector.

Additionally, it goes without saying that various design modifications are possible within a scope which does not modify the intention of the present invention.

We claim:

1. An inspection device for an electrical connector having a housing, a terminal accommodation chamber which extends through the housing, a terminal within the chamber and a closure plug for one end aperture of the chamber, said closure plug being integral with said terminal, and wherein said device comprises a frame having a position setting surface defining a pre-determined inspection position for a housing of an electrical connector, a stopping member movable with respect to the frame to hold said housing in said pre-determined inspection position, and a pressing member of one of the frame and stopping members, the pressing member being positioned to abut a closure plug which is not fully inserted in the housing so as to press the closure plug into the housing as the housing is moved into said pre-determined inspection position in use.

2. An inspection device according to claim 1 wherein said frame includes a lever member to move the stopping member relative thereto, the lever member including an over centre mechanism to lock the frame and stopping member at a predetermined separation distance.

3. An inspection device according to claim 1 wherein said pressing member projects from said frame.

4. An inspection device according to claim 3 wherein said pressing member is of substantially semi-circular form.

5. An inspection device according to claim 3 wherein a plurality of pressing members are provided.

6. An inspection device according to claim 1 wherein said stopping member includes a projecting detector member for contact with a terminal of the connector, said detector having a resilient biasing member to urge it outwardly of the stopping member, and being movable inwardly of the stopping member against the effect of said biasing member on contact with said terminal in use.

7. An inspection device according to claim 6 wherein said detector member is of electrically conducting material.

8. An inspection device according to claim 7 and further including an electrical switch, the detector member constituting one contact of said electrical switch.

9. An inspection device according to claim 8 wherein said electrical switch includes a second contact and a resilient member to bias said second contact towards the detector member.

10. An inspection device according to claim 9 wherein said switch is normally open.

11. An inspection device according to claim 6 wherein a plurality of detector members are provided.

12. An inspection device according to claim 9 wherein a plurality of said detector members and a plurality of said switches are provided, one switch for each detector member.

13. An inspection device according to claim 1 wherein said stopping member includes a pushing member for contact with the housing of the connector, said pushing member being resiliently biased outwardly of the stopping member.

14. An inspection device according to claim 12 wherein a plurality of pushing members are provided.

15. In combination, an electrical connector having a housing, a terminal accommodation chamber which extends through the housing, a terminal within the chamber and a closure plug for one end aperture of the chamber, said plug being integral with said terminal; and an inspection device comprising a frame having a position setting surface defining a pre-determined inspection position for said housing, a stopping member movable with respect to the frame to hold said housing in said inspection position, and a pressing member of one of the frame and stopping members, the pressing member being adapted for abutment with said closure plug so as to press the plug into the housing as the housing is moved into said pre-determined position in use.

16. The combination of claim 15 wherein said connector is movable by said stopping member with respect to said frame from a pre-inspection position to said inspection position.

\* \* \* \* \*